(12) United States Patent
Escoffier et al.

(10) Patent No.: US 11,222,967 B2
(45) Date of Patent: Jan. 11, 2022

(54) HETEROJUNCTION TRANSISTOR WITH VERTICAL STRUCTURE

(71) Applicants: COMMISSARIAT A L'ENERGIE ATOMIQUE ET AUX ENERGIES ALTERNATIVES, Paris (FR); RENAULT S.A.S., Boulogne-billancourt (FR)

(72) Inventors: Rene Escoffier, La Buisse (FR); Serge Loudot, Villiers le Bacle (FR)

(73) Assignees: COMMISSARIAT A L'ENERGIE ATOMIQUE ATOMIQUE ET AUX ENERGIES ALTERNATIVES, Paris (FR); RENAULT S.A.S., Boulogne-billancourt (FR)

( * ) Notice: Subject to any disclaimer, the term of this patent is extended or adjusted under 35 U.S.C. 154(b) by 198 days.

(21) Appl. No.: 16/464,190

(22) PCT Filed: Nov. 14, 2017

(86) PCT No.: PCT/FR2017/053114
§ 371 (c)(1),
(2) Date: May 24, 2019

(87) PCT Pub. No.: WO2018/100262
PCT Pub. Date: Jun. 7, 2018

(65) Prior Publication Data
US 2020/0295173 A1    Sep. 17, 2020

(30) Foreign Application Priority Data
Nov. 29, 2016  (FR) ..................................... 1661614

(51) Int. Cl.
*H01L 29/778* (2006.01)
*H01L 29/20* (2006.01)
*H01L 29/66* (2006.01)

(52) U.S. Cl.
CPC ...... *H01L 29/7787* (2013.01); *H01L 29/2003* (2013.01); *H01L 29/66462* (2013.01)

(58) Field of Classification Search
CPC ............. H01L 29/7787; H01L 29/2003; H01L 29/66642
See application file for complete search history.

(56) References Cited

U.S. PATENT DOCUMENTS

2008/0128862 A1\* 6/2008 Sugimoto ........... H01L 29/7802
257/615
2015/0270356 A1\* 9/2015 Palacios ................ H01L 21/283
257/76

(Continued)

OTHER PUBLICATIONS

Ji Dong et al. "A Discussion on the DC and switching performance of a gallium nitride CAVET for 1.2kV application" 2015 IEEE 3rd Workshop on Wide Bandgap Power Devices and Applications (WIPDA), IEEE,Nov. 2, 2015 (Nov. 2, 2015), pp. 174-179, XP032839610, DOI: 10.1109/WIPDA.2015.7369308 (Year: 2015).\*

(Continued)

*Primary Examiner* — Timor Karimy
(74) *Attorney, Agent, or Firm* — Oblon, McClelland, Maier & Neustadt, L.L.P.

(57) ABSTRACT

The invention concerns a heterojunction field-effect transistor comprising a stack of first and second III-N type semi-conducting layers forming an electron gas or hole layer; a first conduction electrode in electrical contact with the gas layer and a second conduction electrode; a separation layer positioned vertically in line with the first electrode and under the second semiconducting layer; a third semiconducting layer arranged under the separation layer and in electrical contact with the second electrode; a conductive element in electrical contact with the gas layer and electrically connecting the third semiconducting layer and the gas layer; and (Continued)

a control gate positioned between the conductive element and the first conduction electrode.

18 Claims, 9 Drawing Sheets

(56) References Cited

U.S. PATENT DOCUMENTS

2016/0093691 A1* 3/2016 Echigoya ............ H01L 29/7393
 257/76
2016/0322466 A1* 11/2016 Simin ................ H01L 29/6609

OTHER PUBLICATIONS

Jones K A et al: "AlGaN devices and growth of device structures", Journal of Materials Science, Kluwer Academic Publishers, Dordrecht, vol. 50, No. 9, Feb. 24, 2015, pp. 3267-3307, XP035458464, ISSN:0022-2461, DOI: 10.1007/S10853-015-8878-3 [retrieved on Feb. 24, 2015] (Year: 2015).*

International Search Report dated May 1, 2018 in PCT/FR2017/053114, citing documents AA-AC and AX-AY therein, 3 pages.

Ji, D. et al. "A Discussion on the DC and Switching Performance of a Gallium Nitride CAVET for 1.2kV Application" 2015 IEEE $3^{rd}$ Workshop on Wide Bandgap Power Devices and Applications (WIPDA), XP032839610, 2015, 6 pages.

Jones, K.A. et al. "AlGaN devices and growth of device structures" Journal of Materials Science, vol. 50, No. 9, XP035458464, 2015, 41 pages.

* cited by examiner

HETEROJUNCTION TRANSISTOR WITH VERTICAL STRUCTURE

The invention relates to heterojunction transistors, and in particular to heterojunction transistors with vertical structure.

Numerous electronic applications now require an improvement in performance especially in onboard electronics intended for automobiles and ground transport, in aeronautics, in medical systems or in home automation solutions, for example. These applications generally require switches for high power operating in ranges of frequencies often above megahertz.

Historically, for a long time high-frequency switches have used field-effect transistors based on a semiconductor channel, most often of silicon. For lower frequencies, junction transistors are preferred as they support higher current densities. However, owing to the relatively limited breakdown voltage of each of these transistors, power applications require the use of a large number of transistors in series, or transistors that have more extensive space charge zones, which leads to a higher flow resistance. The losses through these transistors in series are considerable, both in steady conditions and during switching.

An alternative for power switches, notably at high frequencies, is the use of heterojunction field-effect transistors, also known by the term heterostructure field-effect transistor. Transistors of this kind notably include high electron mobility transistors (HEMTs).

In particular, a high electron mobility transistor includes the superposition of two semiconductor layers having different bandgaps, which form a quantum well at their interface. Electrons are confined in this quantum well, forming a two-dimensional gas of electrons. For reasons of durability at high voltage and at temperature, these transistors are selected so as to have a wide energy bandgap.

The most common architecture for heterojunction transistors is based on a vertical stack of semiconductor layers on a substrate. A transistor of this kind is said to be of lateral structure, the source, the drain and the gate of the transistor being arranged in its upper part with the source and the drain positioned on either side of the gate.

However, for a high current density, a lateral transistor requires considerable space for accommodating a sufficiently wide electron gas layer. Besides the fact that a lateral transistor of this kind occupies a large area of the substrate, these transistors are limited in dimensions: the level of defects in a semiconductor material used for forming the electron gas layer is a problem for transistors with an area exceeding about 50 mm$^2$. Above this area, the proportion of defective transistors in the fabrication process has a considerable effect on its profitability. Moreover, the source and the drain necessary for a high current density occupy a substantial proportion of this substrate surface, further limiting the width available for the electron gas layer.

Heterojunction transistors with vertical structure were developed for this purpose. The document 'Vertical Gallium Nitride transistors with buried p-type current blocking', published on May 21, 2015 by the University of Santa Barbara in California by M. Ramya Yeluri in volume 106 of Applied Physics Letters, describes an example of the configuration of a heterojunction transistor with vertical structure. This transistor comprises a first layer of GaN, n-doped on the rear face. A metal drain is formed under this first layer of GaN. This first layer of GaN is covered by a second layer of GaN, with n-type doping with a lower concentration. The second layer of GaN is covered by a third layer of GaN, with p-type doping. The second layer forms a prolongation through the third layer, this prolongation being denoted by the term window. The third layer of GaN is covered by a fourth layer of GaN, of the type that is not intentionally doped. The window is in contact with this fourth layer of GaN. Owing to the presence of the third layer pGaN under the fourth layer of GaN, resistance to voltage breakdown is provided not only by the thickness of the second layer but also by the length of the fourth layer between the source and the window, thus reducing the amplitude of the electric field in the GaN between the source and the drain.

The fourth layer of GaN is covered by a layer of AlGaN, so as to form an electron gas layer near their interface. A gate insulator is formed on the layer of AlGaN directly above the window. This gate insulator is covered by the metal gate. Sources are formed on either side of the gate, displaced laterally relative to the window. The sources are in electrical contact with the electron gas layer. As the conduction path uses a large part of the surface of the transistor, a high current density may be obtained for a smaller substrate surface area than with a transistor with lateral structure. The leakage currents between source and drain in the off-state are also reduced. Moreover, moving the drain to the rear face allows further reduction of the surface area of the transistor on the substrate.

A transistor of this kind has some drawbacks. The fabrication process for a transistor of this kind includes depositing the first to the third layers by epitaxial growth. The substrate is then brought out of the epitaxy reactor, and an etching step is carried out through the third layer to form a groove, until the second layer is reached. The substrate is then put back in the epitaxy reactor to grow the window, the fourth layer, and the layer of AlGaN. The source and the gate are formed in subsequent steps. Because the substrate is removed from the epitaxy reactor, the bottom of the groove becomes contaminated, requiring a cleaning step before undertaking epitaxial growth of the window. A fabrication process of this kind therefore proves relatively complex and may lead to discontinuities during epitaxial deposition at the bottom of the groove. Moreover, the on-state resistance of a transistor of this kind is still found to be relatively high, despite the use of conduction by heterojunction between the source and directly above the gate.

Document US2008/0128862 describes a heterojunction field-effect transistor. A drain is made on the rear face against a bottom layer of semiconductor material. A separating layer of semiconductor material is made on the bottom layer. An element passes through the separating layer and is in contact with the bottom layer. Alongside the element that passes through, a source is made, in electrical contact with an electron gas layer, and a gate is made between the source and the element passing through.

A transistor of this kind has limited performance, notably with a relatively low conduction current density.

The invention aims to solve one or more of these drawbacks. The invention thus relates to a heterojunction field-effect transistor and a fabrication process, as defined in the appended independent claims.

The invention also relates to the variants in the dependent claims. A person skilled in the art will understand that each of the features of the variants in the dependent claims may be combined independently with the features of the independent claims, but without constituting an intermediate generalization.

Other features and advantages of the invention will become clear from the description given hereunder, as a guide and not in any way limiting, referring to the appended drawings, in which.

Figure 1:
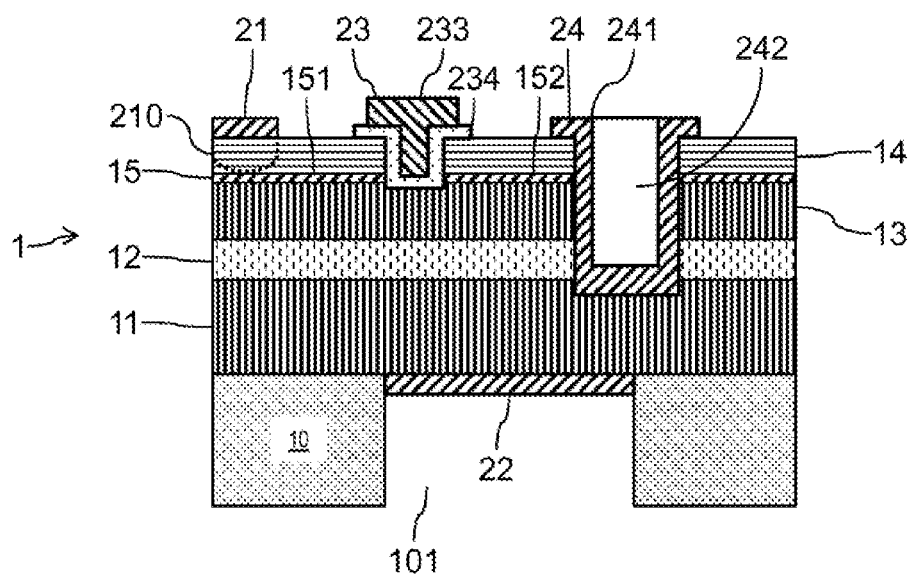
FIG. 1 is a schematic cross-sectional view of an example of a heterojunction transistor according to a first embodiment of the invention.

FIG. 1 is a schematic cross-sectional view of an example of a heterojunction transistor 1 according to a first embodiment of the invention. This transistor 1 is in this case of the type with high electron mobility. Here, this transistor 1 is of the normally open type.

The transistor 1 comprises a substrate 10. The substrate 10 may for example be an electrical insulator or a semiconductor material of the intrinsic or p-doped silicon type. The substrate 10 may be for example of the type of silicon with lattice orientation (111). The substrate 10 may also be silicon carbide, $Al_2O_3$ or diamond. Said substrates 10 advantageously allow layers of GaN to be grown by epitaxy. The substrate 10 may typically have a thickness of the order of 650 μm, typically between 500 μm and 2 mm.

The transistor 1 advantageously comprises in this case one or more adaptation layer(s) (not illustrated) arranged on the substrate 10. The adaptation layer may be deposited on the substrate 10 in a manner known per se, and serves as an intermediate between the substrate 10 and a layer of semiconductor material 11, to allow lattice adaptation between the substrate 10 and the layer 11. The adaptation layer may typically be of aluminum nitride. Layer 11 may have a buffer function for managing the mechanical stresses connected with any difference of lattice parameters with the substrate 10.

Layer 11 may be produced using a III-N semiconductor material, such as GaN that has not been intentionally doped. Layer 11 may also advantageously be made of semiconductor material having n-type doping, for example n-doped GaN (with a concentration of dopants for example between $1 \times 10^{16}$ cm$^{-3}$ and $5 \times 10^{16}$ cm$^{-3}$).

The transistor 1 comprises a separating layer 12 formed on layer 11. This separating layer 12 is in this case of semiconductor material of the III-V alloy type (for example a binary alloy of type III-V, for example of element III nitride, typically GaN).

The transistor 1 comprises a layer 13 of semiconductor material of the III-V alloy type (for example a binary alloy of type III-V, for example of element III nitride, typically GaN) disposed on layer 12.

The transistor 1 further comprises a layer 14 of semiconductor material of the III-V alloy type (for example a ternary alloy of type III-V, for example of element III nitride, typically AlGaN or InAlN, or else a quaternary alloy of element III nitride, for example $Al_xGa_yIn_{(1-x-y)}N$, keeping a bandgap above that of the material of layer 13). Layer 14, typically called a barrier layer, may typically have a thickness between nm and 40 nm, for example 25 nm. The semiconductor layers 13 and 14 are superposed in a manner known per se to form an electron gas layer 15 at the interface or near the interface between these layers 13 and 14.

The transistor 1 comprises an upper conduction electrode 21, comparable to the source. The electrode 21 is in this case formed on the layer 14 and forms an electrical contact with the electron gas layer 15. The electrical contact between electrode 21 and the electron gas layer 15 is in this case formed by a diffusion zone 210 of the metal of electrode 21 in layer 14.

The transistor 1 comprises a lower conduction electrode 22, comparable to the drain. The electrode 22 is in electrical contact with a lower face of layer 11. The electrode 22 is in this case housed in a recess 101 made in the substrate 10. This kind of configuration takes advantage of the rigidity of the substrate 10 for stiffening the entire transistor.

The transistor 1 comprises a gate 23 displaced laterally relative to electrode 21. The gate 23 is in this case configured to form a transistor of the normally open type, the gate 23 being in this case of the type formed in a recess through layer 14. The gate 23 is configured for selectively insulating and connecting electrically two parts 151 and 152 of the electron gas layer 15. The gate 23 is in this case formed in a recess interrupting the electron gas layer 15. The gate 23 comprises a gate insulator 234 covering the side walls and the bottom of this recess. The gate 23 comprises a gate metal 233 made on the gate insulator 234 and in this case in the absence of polarization on gate 23, conduction under this gate is interrupted. On applying polarization exceeding the threshold voltage on gate 23, conduction under gate 23 takes place by means of layer 13.

The transistor 1 further comprises a conducting element 24. The gate 23 is positioned between the conducting element 24 and the conduction electrode 21. The conducting element 24 is in electrical contact with part 152 of the electron gas layer 15. The conducting element 24 passes through the separating layer 12 and is then in contact with layer 11. The conducting element 24 connects layer 11 electrically to part 152 of the electron gas layer. Here, the conducting element 24 comprises a conductive layer 241 covering the side walls and the bottom of a groove. Here, the rest of the groove is filled with another material 242, formed on the conductive layer 241. The other material 242 may be of dielectric or conductive type.

In this example, the separating layer 12 is of semiconductor material with p-type doping, layers 11 and 13 being either of the type that is not intentionally doped, or with n-type doping. In this example, layer 13 forms a separation between layer 14 and the separating layer 12.

The conduction path in the on-state extends from the electrode 21, passing through part 151, layer 13 between parts 151 and 152, part 152, conducting element 24, the thickness of layer 11 and electrode 22. As conduction in the on-state between the conduction electrode 21 and the conducting element 24 is provided essentially by the electron gas layer 15, this length only has a moderate effect on the on-state resistance of the transistor 1. The transistor 1 behaves as a lateral transistor between electrode 21 and the conducting element 24, and as a vertical transistor between the conducting element 24 and the electrode 22. Owing to the use of the conducting element 24 for ensuring conduction through the separating layer 12, a high concentration of dopant may be used in layer 12 without altering the on-state resistance of the transistor, which makes it possible to reinforce the resistance of voltage breakdown of the transistor 1. This kind of configuration of the transistor with electrode 22 moved to the rear face makes it possible, moreover, to preserve the advantages of a reduction in surface area of substrate 10 that is occupied.

With the separating layer 12 extending from electrode 21 to the conducting element 24, passing under gate 23, it is possible to take advantage of the length of the layer 13 directly above to contribute to the resistance to voltage breakdown in the off-state of transistor 1. The separating layer 12 also has the function of preventing a leakage current between conduction electrode 21 and conduction electrode 22 in the off-state of transistor 1. In particular, the separating layer 12 is in this case in contact with the semiconductor element 24 on the whole circumference of the latter.

The conducting element 24 advantageously has a width of 100 nm or more. The conducting element 24 advantageously has a depth between 200 and 500 nanometers. The conducting element 24 advantageously has a width-to-depth ratio between 0.2 and 0.5, notably so as to promote filling of the groove by the conductive layer 241 and by the filler 242.

The distance between the conducting element 24 and the gate 23 is advantageously at least equal to 2 μm. Owing to a small distance between the conducting element 24 and the conduction electrode 22 (discussed in detail later), that between the conducting element 24 and the gate 23 is advantageously increased to increase the voltage strength of the transistor 1.

The conducting element 24 penetrates into the semiconductor layer 11 advantageously to a depth at least equal to 10 nm, preferably between 50 and 100 nanometers. Projection of the conducting element 24 into layer 11 makes it possible to guarantee electrical contact between it and layer 11 through layer 12.

In order to reduce the on-state resistance of the transistor 1, at least part of the conduction electrode 22 is positioned directly below the conducting element 24.

In order to increase the on-state current density of the transistor 1, simulations demonstrated that a distance at most equal to 1 μm between the conduction electrode 22 and the conducting element 24 (corresponding to the thickness of layer 11 separating the conduction electrode 22 and the conducting element 24) proved particularly advantageous. It may also be envisaged that this distance should be at most equal to 700 nm.

Layer 11 is for example of the GaN type that is not intentionally doped or that has n-type doping at reduced concentration. For example, layer 11 may be n-type GaN having a concentration of dopant between $1\times10^{16}$ cm$^{-3}$ and $5\times10^{16}$ cm$^{-3}$.

Layer 12 may typically have a thickness from 30 nm to 150 nm. Layer 12 is advantageously of p-doped GaN with a concentration in the range from $1\times10^{17}$ cm$^{-3}$ to $3\times10^{17}$ cm$^{-3}$.

Layer 13 may for example have a thickness typically between 50 and 200 nm. The semiconductor material of layer 13 may be identical to that of layer 11.

The material of electrode 21 is for example titanium, aluminum, or an alloy of titanium and aluminum. The material of electrode 21 is advantageously identical to that of the layer of metal 241 of the conducting element 24. Thus, one and the same deposition step may be used for forming the metal of electrode 21 and the layer of metal 241. The electrodes 21 and 22 may use one and the same metal.

According to other variants not described in detail, electrical contact between the electron gas layer 15 and the conduction electrode 21 may be made laterally, for example if the conduction electrode 21 is made in a recess passing through layer 14 and reaching layer 13.

Here, the transistor 1 is of the normally open type, obtained by interruption of the electron gas layer by a recess in layer 14. Other variants of transistor of the normally open type may of course also be produced, for example transistors comprising implantations of dopants directly above the channel zone.

Figure 2:
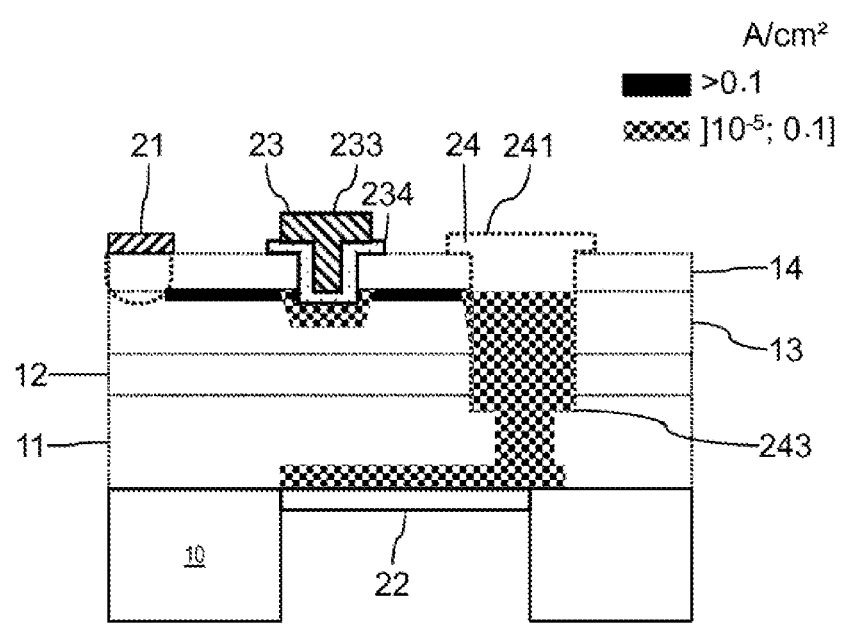
FIG. 2 is a diagram illustrating an example of on-state current density of the transistor in FIG. 1.

FIG. 2 is a diagram illustrating an example of on-state current density of the transistor 1, in the sectional view in FIG. 1.

Figure 3:
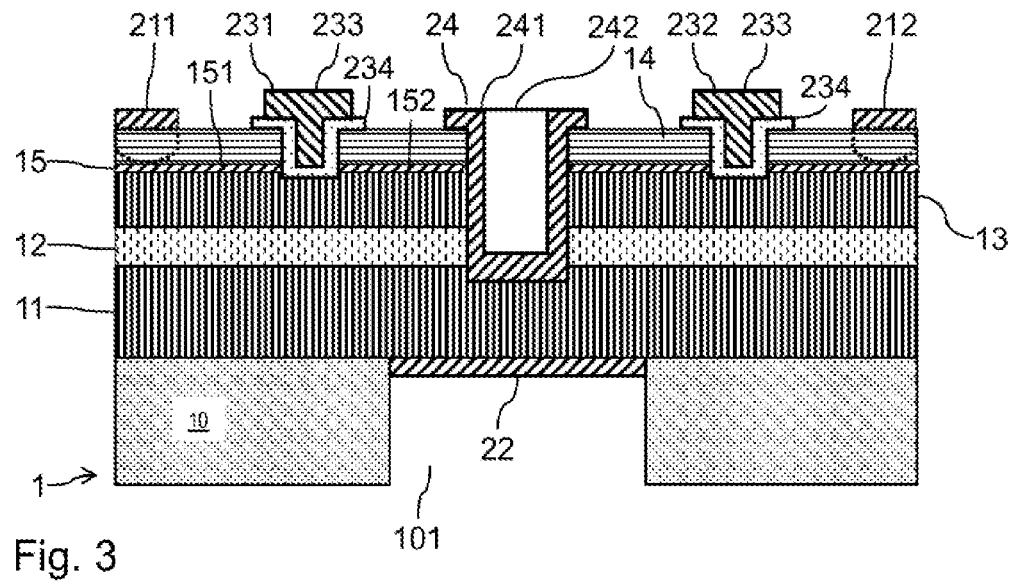
FIG. 3 is a schematic cross-sectional view of an example of a heterojunction transistor according to a second embodiment of the invention.

FIG. 3 is a schematic cross-sectional view of an example of a heterojunction transistor 1 according to a second embodiment of the invention. This transistor 1 is in this case of the type with high electron mobility. This transistor 1 is in this case of the normally open type. Here, the transistor 1 has sources and gates split on either side of a conducting element 24.

The transistor 1 of the second embodiment again has the substrate 10 and the stack of layers 11 to 14 with the same thicknesses and compositions as described for the first embodiment. The conducting element 24 is identical to that of the first embodiment. A conduction electrode 211 is identical to the conduction electrode 21 of the first embodiment. A gate 231 is identical to gate 23 of the first embodiment.

Here, the transistor 1 comprises another gate 232. The gate 232 has the same structure as gate 231 and is positioned symmetrically to gate 231 relative to the conducting element 24. The gate 232 is thus configured for selectively insulating and connecting electrically two parts of the electron gas layer 15. The gate 232 is also formed in a recess interrupting the electron gas layer 15.

The transistor 1 also comprises another conduction electrode 212. The conduction electrode 212 has the same structure as the conduction electrode 211 and is positioned symmetrically to the conduction electrode 211 relative to the conducting element 24. The conduction electrode 212 is connected electrically to the electron gas layer 15. The gate 232 is thus positioned between the conducting element 24 and the conduction electrode 212.

The drain 22 is in this case positioned directly below the conducting element 24, and is centered relative to this conducting element 24.

The conduction path in the on-state extends:

on the one hand from the electrode 211, passing through part 151, layer 13 between parts 151 and 152, part 152, conducting element 24, the thickness of layer 11 and the electrode 22; and on the other hand from the electrode 212, passing through the electron gas layer 15, layer 13 under gate 232, the electron gas layer 15, the conducting element 24, the thickness of layer 11 and the electrode 22.

Figure 4:
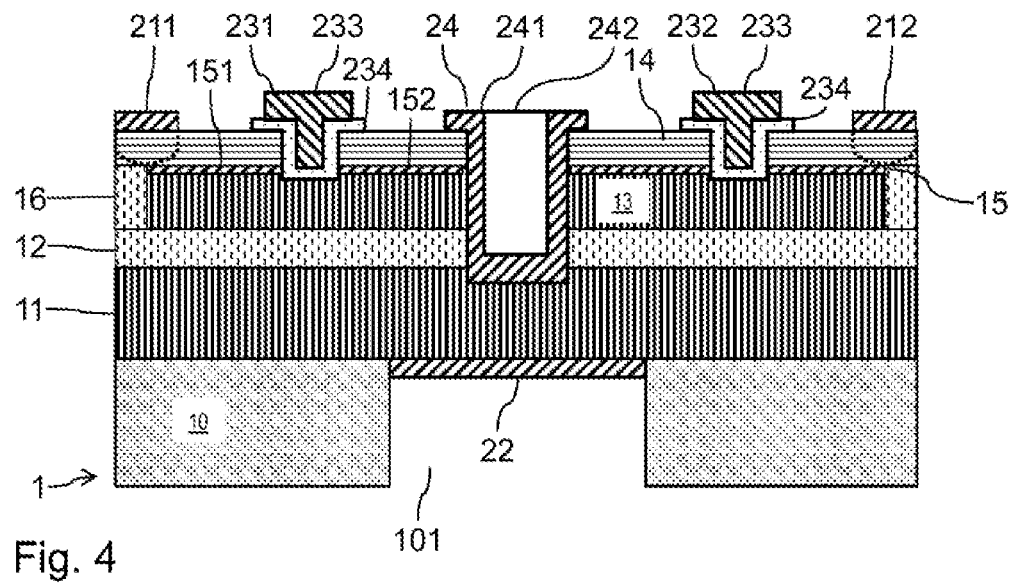
FIG. 4 is a schematic cross-sectional view of an example of a heterojunction transistor according to a third embodiment of the invention.

FIG. 4 is a schematic cross-sectional view of an example of heterojunction transistor 1 according to a third embodiment of the invention. This transistor 1 is in this case of the type with high electron mobility. Here, this transistor 1 is of the normally open type. The transistor 1 of the third embodiment has a structure roughly identical to that of transistor 1 of the second embodiment. The transistor 1 of the third embodiment differs from that of the second embodiment as follows.

The transistor 1 has in this case elements 16 of semiconductor material having the same type of doping as the separating layer 12. The elements 16 are for example made of the same material as the separating layer 12. The elements 16 connect layer 14 to the separating layer 12. The elements 16 thus pass through layer 13. An element 16 is positioned directly below the conduction electrode 211 and is connected to the potential of the conduction electrode 211, another element 16 being positioned directly below the conduction electrode 212 and connected to the potential of the conduction electrode 212. In this embodiment, the separating layer 12 may thus be polarized to the potential of the conduction electrodes 211 and 212.

In this variant, we may advantageously increase the distance between the gates 231, 232 and the conducting element 24, to take account of the polarization of layer 12.

Figure 5:
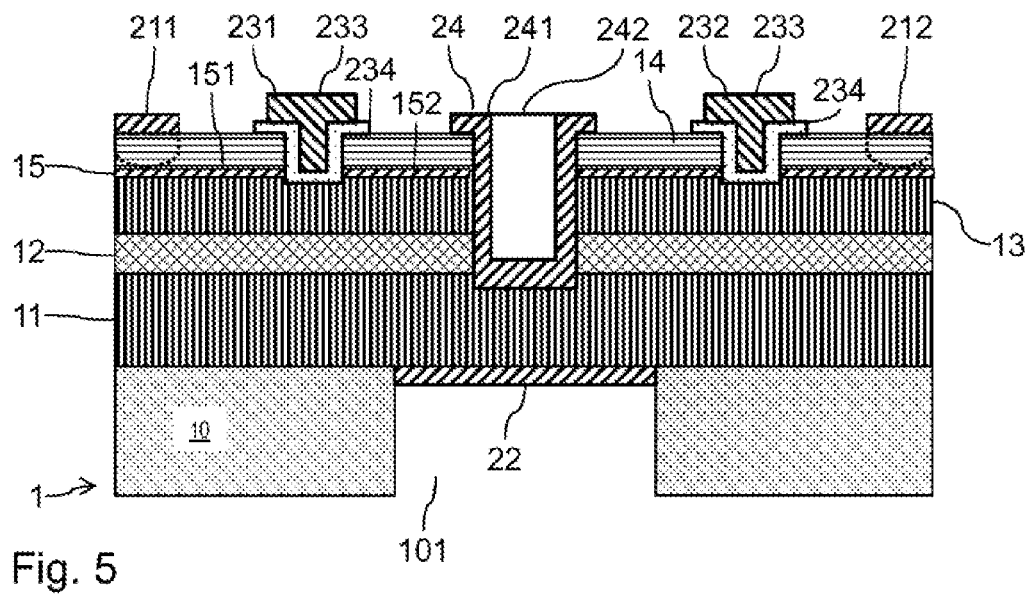
FIG. 5 is a schematic cross-sectional view of an example of a heterojunction transistor according to a fourth embodiment of the invention.

FIG. 5 is a schematic cross-sectional view of an example of a heterojunction transistor 1 according to a fourth embodiment of the invention. This transistor 1 is in this case of the type with high electron mobility. Here, this transistor 1 is of the normally open type. The transistor 1 of the fourth embodiment has a structure roughly identical to that of transistor 1 of the second embodiment. The transistor 1 of the third embodiment differs from that of the second embodiment as follows: the separating layer 12 is in this case formed of a dielectric material. The leakage currents to the substrate in the on-state of the transistor are thus reduced appreciably.

FIGS. 6 to 12 illustrate different steps of an example of fabrication process for a transistor 1 according to the fourth embodiment.

Figure 6:
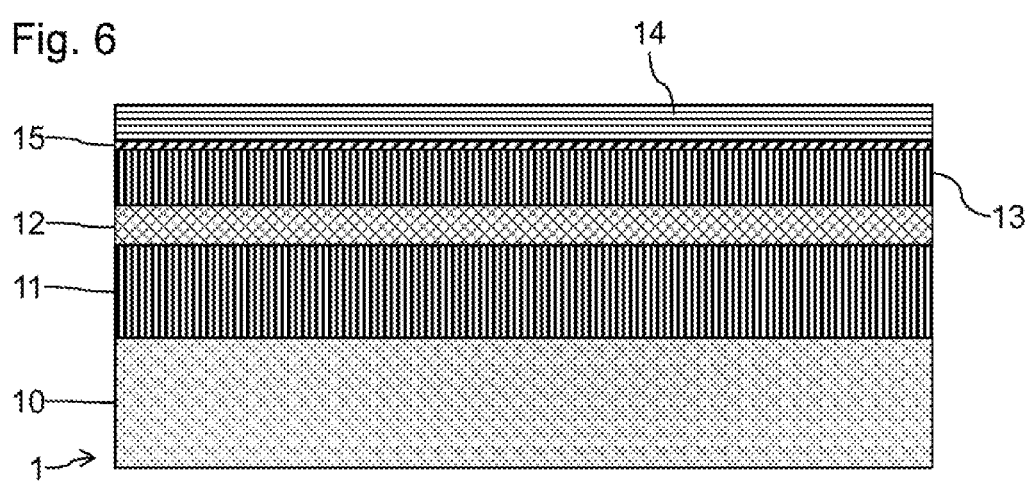
FIGS. 6 to 12 illustrate different steps of an example of fabrication process of the heterojunction transistor according to the fourth embodiment of the invention.

In FIG. 6, a substrate 10 is supplied, surmounted by a stack of layers of semiconductor material 11, 12, 13 and 14. Layers 11 to 14 are typically produced in a manner known per se, for example by steps of epitaxial growth (of the MOCVD type: metal-organic chemical vapor deposition) of the various layers. Deposition by epitaxial growth can be carried out without removing the substrate 10 from the epitaxy reactor.

Layer 11 is in this case a layer of GaN of the type that is not intentionally doped, layer 12 is a layer of GaN with p-type doping, layer 13 is a layer of GaN of the type that is not intentionally doped, and layer 14 is a layer of AlGaN. Layers 11 to 14 may have the thicknesses and concentrations of dopant described with reference to the fourth embodiment. Owing to superposition of layers 13 and 14, an electron gas layer 15 is obtained near their interface in a manner known per se.

Figure 7:
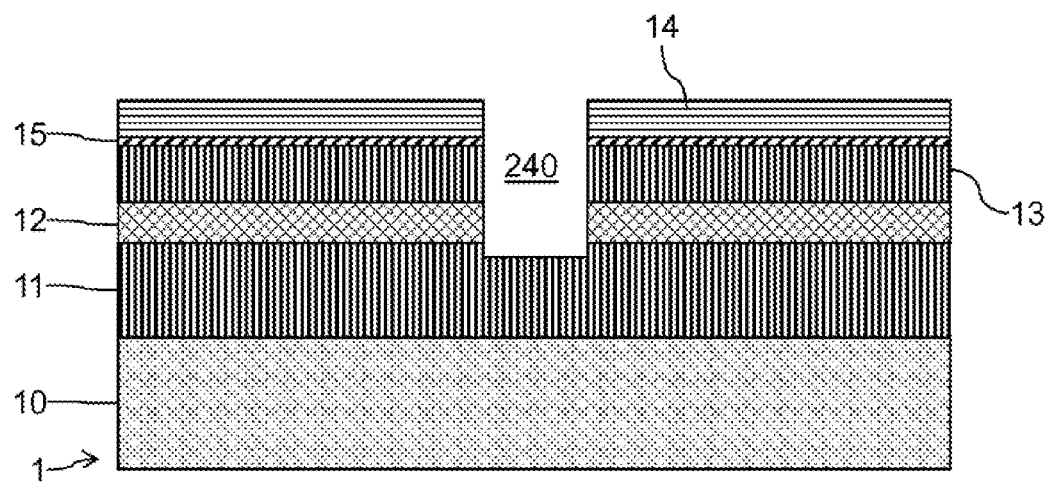

In FIG. 7, an etching step has been undertaken (typically using preliminary steps of masking and photolithography not described in detail) for etching a groove 240 through layers 12, 13 and 14 (and therefore the electron gas layer 15). Here, etching is continued for prolonging the groove 240 into layer 11. Etching is notably continued to guarantee that the groove 240 passes through layer 12 properly, and so that the distance between the bottom of the groove 240 and the bottom of layer 11 is at most equal to 1 μm. Etching of this kind can be carried out without a barrier layer, by identifying a change of species etched during the process.

Figure 8:
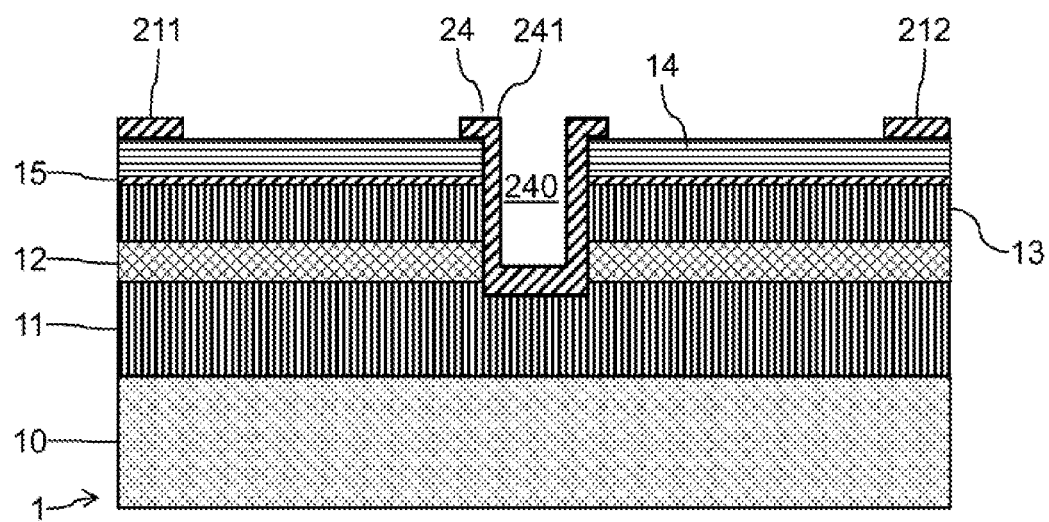

In FIG. 8, metallization of the conduction electrode 211 (and of the split conduction electrode 212) has been carried out by depositing metal on layer 14, and then shaping it. Metallization of the conducting element 24 has also been undertaken, by depositing the layer of metal 241 on the side walls and the bottom of the groove 240 in particular, and then shaping it. The layer of metal 241 formed on the side walls of the groove 240 then ensures electrical conduction between the electron gas layer and layer 11. Advantageously, the same deposition of metal has been carried out for the conduction electrodes 211, 212 and for the conducting element 24, followed by the same shaping step. The fabrication process for a transistor according to the invention is thus simplified appreciably. Metallization of the conduction electrode 211 (and/or of electrode 212 and the layer of metal 241) may comprise deposition of metals such as Ti, Al, AlCu or Ta.

Metallization may comprise the deposition of several layers of metal, for example superposition of layers of several metals. Metallization may for example comprise deposition of a superposition of layers of Ti and of Al, of Ti and of AlCu, or a superposition of layers of Ta and of Al. For example, we may envisage the deposition of:
  a 200 nm layer of AlCu on a layer of Ti having a thickness between 10 and 40 nanometers; or
  a 20 nm layer of Ta, on a 200 nm layer of Al, on a 10 nm layer of Ta.

Figure 9:
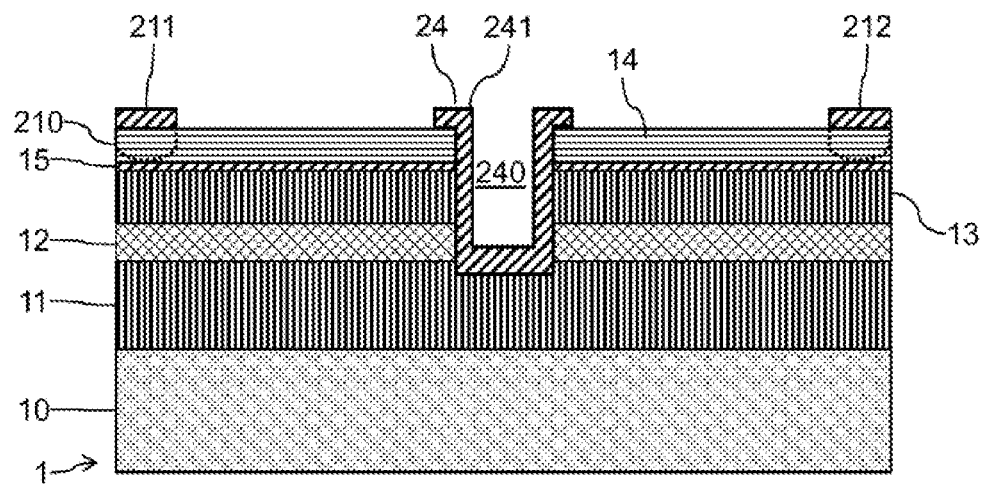

In FIG. 9, an annealing step has been carried out, in order to produce ohmic contact between the conduction electrodes 211 and 212, and the electron gas layer 15, through layer 14. Generally, annealing will be carried out at a temperature between 500° and 600° C., for a time between about ten seconds and two minutes. Annealing will advantageously be carried out at temperatures below 650° C., to avoid the risk of deep diffusion of Ti or Ta into the stack of semiconductor layers, which is could affect the vertical voltage strength of the transistor 1 under the electrodes 211 and 212.

For example, for a superposition of layers of Ti and Al, annealing at 600° C. under nitrogen for about fifteen seconds causes the formation of TiN in layer 14, until a connection is formed with the electron gas layer 15.

Figure 10:
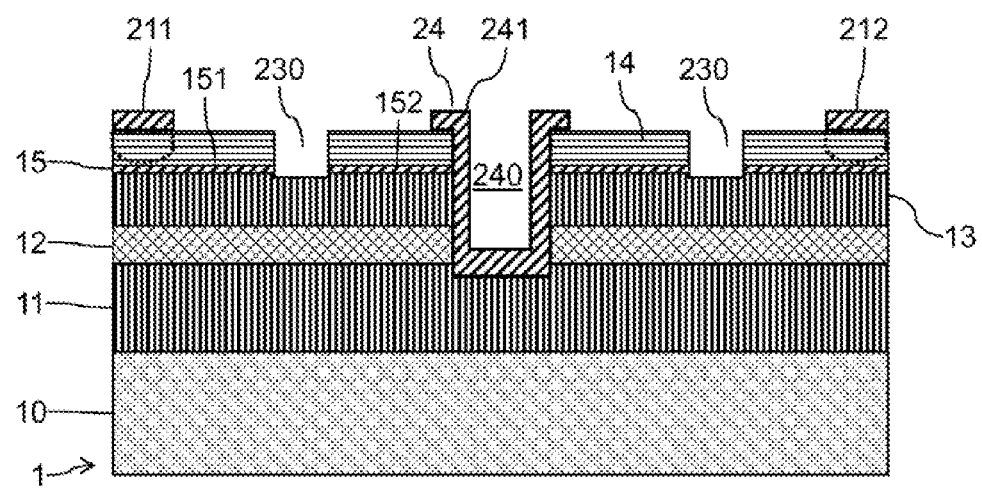

In FIG. 10, a step of formation (typically by etching preceded by steps of masking and photolithography, not described in detail) of grooves 230 has been carried out, on either side and at a distance from the conducting element 24. Here, the grooves 230 are formed through layer 14 until layer 13 is reached, thus interrupting the electron gas layer 15. On either side of the conducting element 24, the electron gas layer 15 is in this case separated into a part 151 in electrical contact with a conduction electrode 211 or 212, and a part 152 in electrical contact with the conducting element 24.

Figure 11:
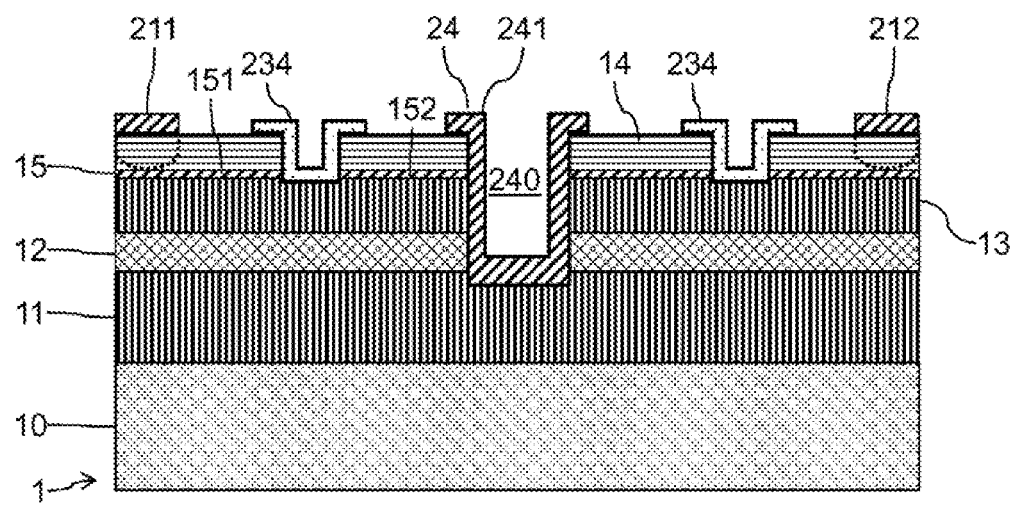

In FIG. 11, formation of a layer of dielectric 234 has been carried out, notably on the walls and the bottom of the grooves 230. The layer of dielectric 234 is for example deposited by a method of the ALD type (atomic layer deposition), promoting crystal quality. The dielectric 234 may be any type of dielectric used as gate insulator. The layer of dielectric 234 may for example have a thickness between 10 and 50 nanometers. Once deposited, the layer of dielectric 234 is shaped in an appropriate manner to reveal the electrodes 211, 212, and the conducting element 24. One part of the grooves 230 is kept above the bottom of the layer of dielectric 234.

Figure 12:
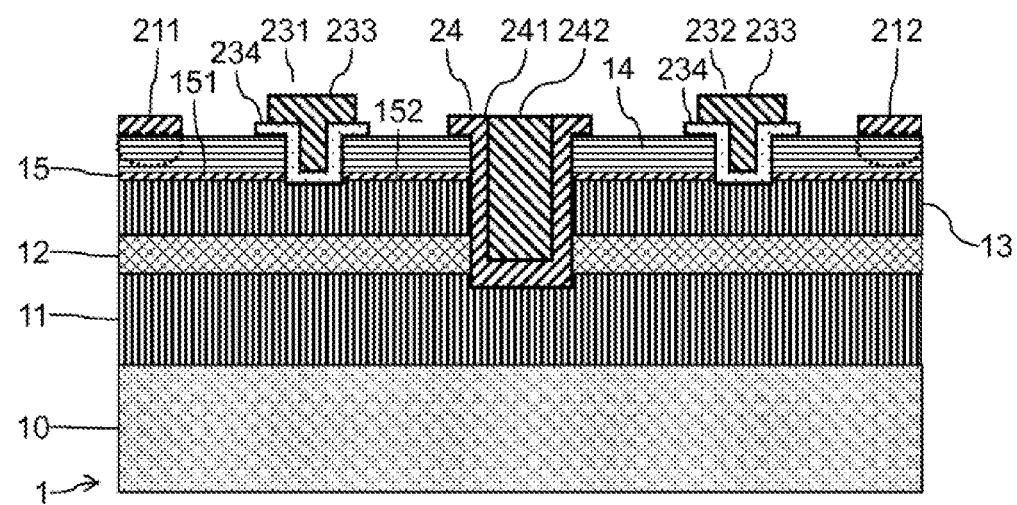

In FIG. 12, a layer of gate metal 233 has been deposited and shaped on the layers of dielectric 234, and notably in the grooves 230. The layer of gate metal 233 is for example formed by deposition of tungsten. Selecting the work function of the gate metal 233 makes it possible, in a manner known per se, to adjust the threshold voltage of the transistor 1. The gates 231 and 232 are obtained at the end of shaping, typically by photolithography and etching.

Figure 13:
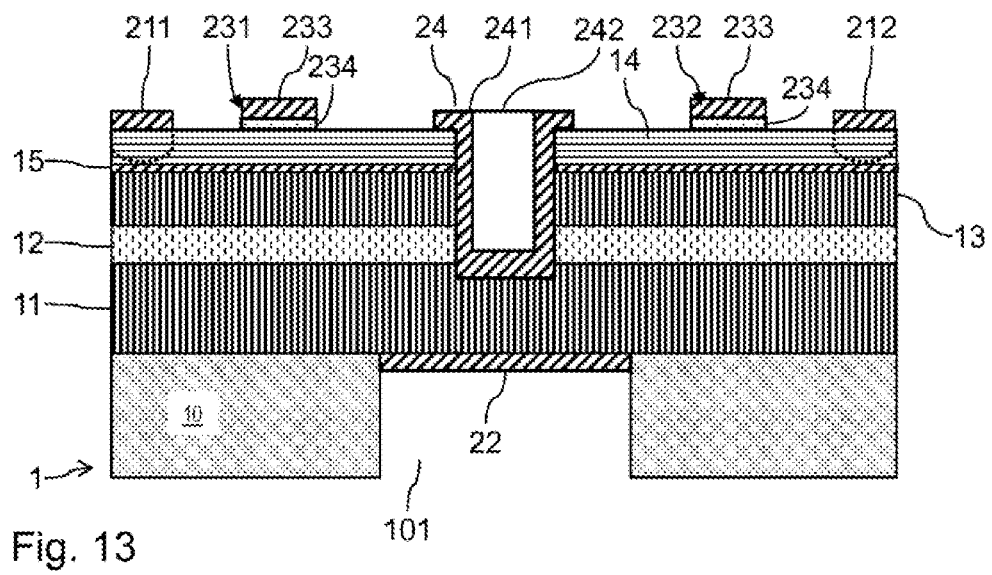
FIG. 13 is a schematic cross-sectional view of an example of a heterojunction transistor according to a fifth embodiment of the invention.

FIG. 13 is a schematic cross-sectional view of an example of heterojunction transistor 1 according to a fifth embodiment of the invention. Here, this transistor 1 is of the type with high electron mobility. This transistor 1 is in this case of the normally closed type.

The transistor 1 of the fifth embodiment again has the substrate 10 and the stack of layers 11 to 14 with the same thicknesses and compositions as described for the second embodiment. The conduction electrodes 211, 212, the conducting element 24 and the drain 22 are identical to those of the second embodiment. The gates 231 and 232 differ from those of the second embodiment in that the gate insulators 234 are formed on layer 14. The electron gas layer 15 thus remains discontinuous between the conduction electrode 211 and the conducting element 24 on the one hand, and between the conduction electrode 212 and the conducting element 24 on the other hand.

Figure 14:
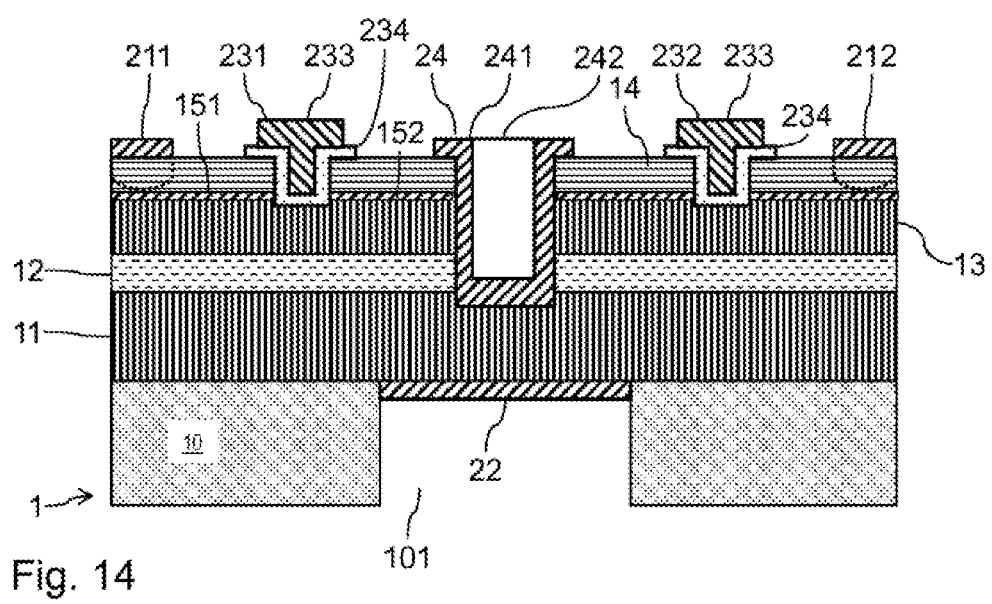
FIG. 14 is a schematic cross-sectional view of an example of a heterojunction transistor according to a sixth embodiment of the invention.

FIG. 14 is a schematic cross-sectional view of an example of heterojunction transistor 1 according to a sixth embodiment of the invention. Here, this transistor 1 is of the hole gas type. This transistor 1 is in this case of the normally open type. The transistor 1 of the sixth embodiment has a structure roughly identical to that of the transistor 1 of the second embodiment. The transistor 1 of the sixth embodiment differs from that of the second embodiment as follows: the separating layer 12 is in this case a layer of semiconductor material with n-type doping.

Figure 15:
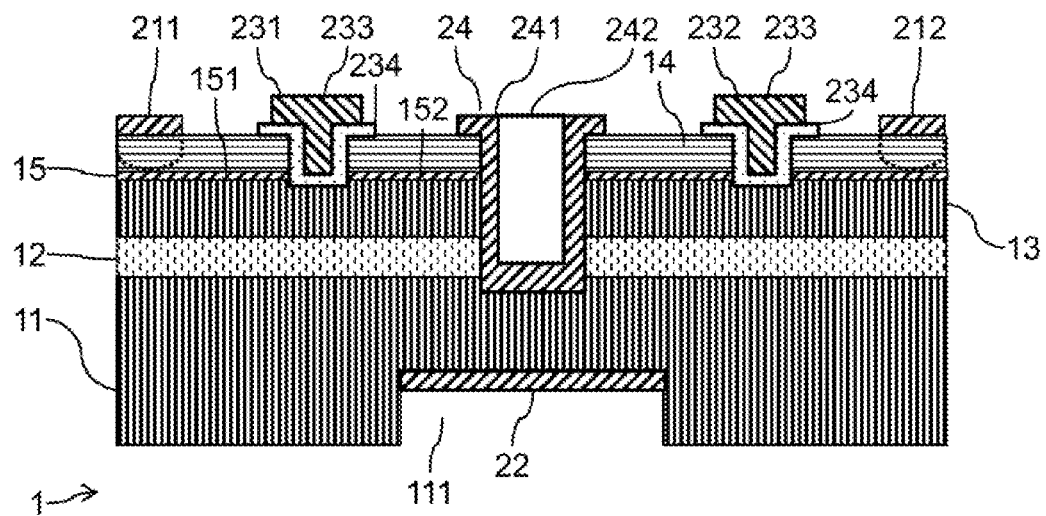
FIG. 15 is a schematic cross-sectional view of an example of a heterojunction transistor according to a seventh embodiment of the invention.

FIG. 15 is a schematic cross-sectional view of an example of heterojunction transistor 1 according to a seventh embodiment of the invention. Here, this transistor 1 is of the type with high electron mobility. This transistor 1 is in this case of the normally open type.

The transistor 1 of the seventh embodiment has a structure roughly identical to that of the transistor 1 of the second embodiment. The transistor 1 of the third embodiment differs from that of the second embodiment as follows:

the transistor 1 does not have the substrate 10; and
the drain 22 is located in a recess 111 made in the thickness of the layer 11 or is made on the whole of the rear face of the layer 11.

This kind of embodiment is obtained for example by a method of separation of the substrate, which makes it possible for example to use more expensive substrates to ensure mechanical durability of the transistor 1 during the steps of the fabrication process, and reuse this substrate for fabricating additional transistors.

Figure 16:
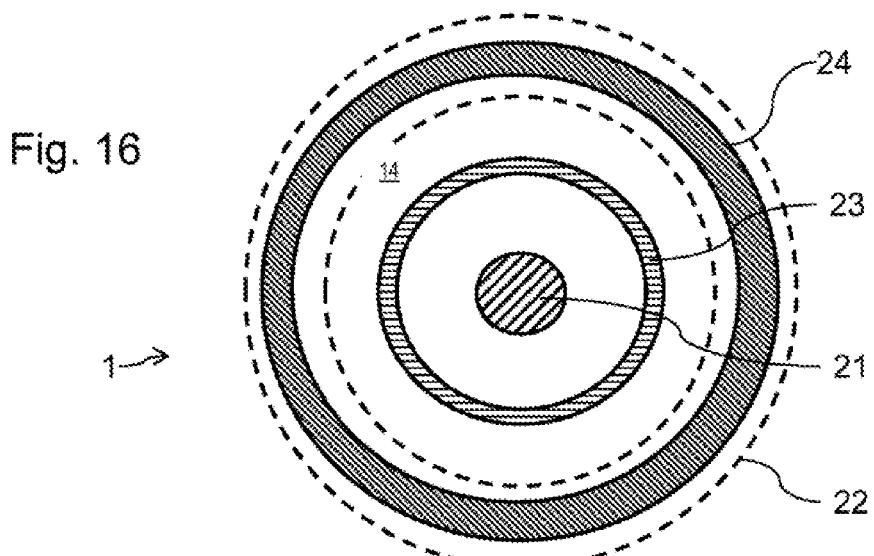
FIG. 16 is a schematic cross-sectional view of an example of a heterojunction transistor according to an eighth embodiment of the invention.

FIG. 16 is a schematic cross-sectional view of an example of a heterojunction transistor 1 according to an eighth embodiment of the invention. Here, this transistor 1 is of the type with high electron mobility. The transistor 1 of the eighth embodiment again has the substrate 10 and the stack of layers with the same thicknesses and compositions as described for layers 11 to 14 of the first embodiment. Layers 11 to 13 and the substrate 10 are not illustrated in this top view.

In this example, the transistor 1 comprises a conducting element 24 at the periphery, surrounding a gate 23. The gate 23 surrounds a central conduction electrode 21. The conduction electrode 21, the gate 23 and the conducting element 24 are made on the layer 14. The transistor 1 comprises another conduction electrode 22, illustrated with a broken line, positioned on the rear face at the level of the substrate. The electrode 22 has an annular shape, positioned directly below the conducting element 24. The conduction electrode 21, the gate 23 and the conducting element 24 have a circular outer edge. The conducting element 24 and the gate 23 have a circular inner edge and have an annular shape. The gate 23 is configured for selectively insulating and connecting electrically an internal part and an external part of an electron gas layer. As in the preceding embodiments, the conducting element 24 connects a part of the electron gas layer electrically to the layer 11. A thickness of the layer 11 is interposed between the conducting element 24 and the conduction electrode 22.

This kind of configuration makes it possible to increase the cross section for flow of current of the conducting element 24. As the conducting element 24 has a resistivity greater than that of the electron gas layer, it is advantageous to increase its flow cross section to reduce the on-state resistance of the transistor 1. There is also a greatly increased cross section for flow of current between the conducting element 24 and the conduction electrode 22.

The eighth embodiment may be applied to a high electron mobility transistor, to a hole gas transistor, to a transistor of the normally open type or of the normally closed type.

Figure 17:
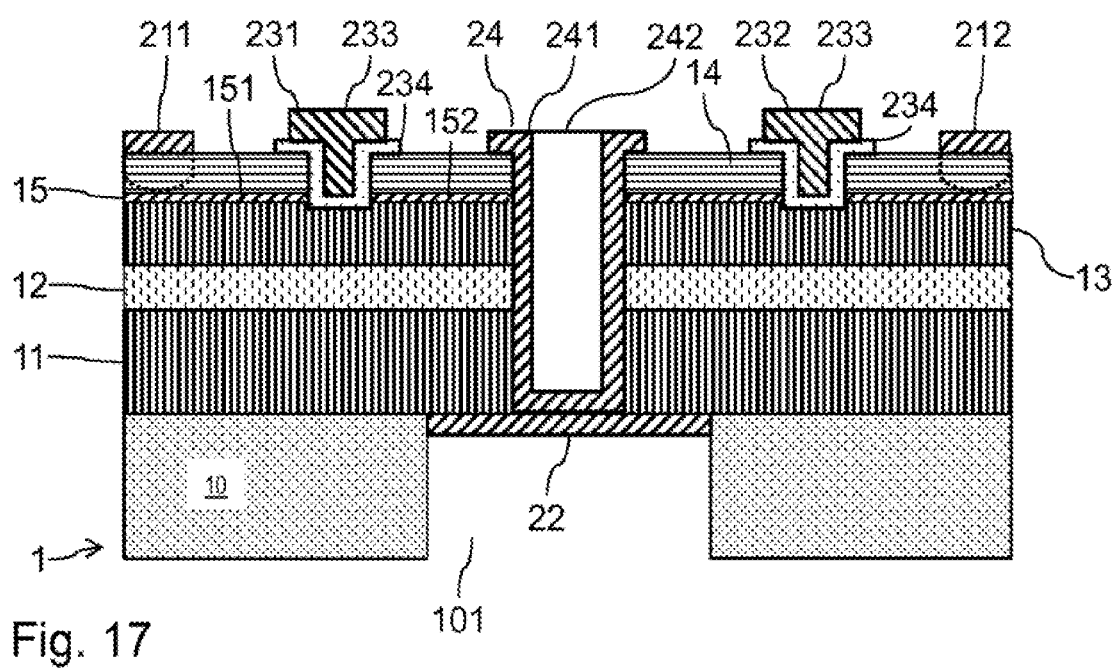
FIG. 17 is a schematic cross-sectional view of an example of a heterojunction transistor according to an eighth embodiment of the invention.

FIG. 17 is a schematic cross-sectional view of an example of a heterojunction transistor 1 according to a ninth embodiment of the invention. Here, this transistor 1 is of the type with high electron mobility. This transistor 1 is in this case of the normally open type. The transistor 1 of the ninth embodiment has a structure roughly identical to that of the transistor 1 of the second embodiment. The transistor 1 of the ninth embodiment differs from that of the second embodiment as follows: the conducting element 24 extends until it is in contact with the conduction electrode 22. Thus, layer 11 is not interposed between the conducting element 24 and the conduction electrode 22.

According to this embodiment, the electrode 21 is insulated from the separating layer 12, to prevent short-circuiting between source and drain via layer 12 and element 24.

The invention claimed is:

1. A heterojunction field-effect transistor, comprising:
a stack of first and second semiconductor layers of type III-N, configured to form a heterojunction at the level of their interface so as to form an electron or hole gas layer;
a first conduction electrode in electrical contact with said electron or hole gas layer;
a separating layer positioned below the first conduction electrode and directly underneath the second semiconducting layer;
a third semiconducting layer arranged beneath the separating layer;
a second conduction electrode in electrical contact with the third semiconducting layer;
a gate configured for selectively insulating and connecting electrically two parts of said electron or hole gas layer; wherein:
the heterojunction field-effect transistor comprises a conducting element in electrical contact with said electron or hole gas layer and passing through the separating layer for connecting electrically the third semiconducting layer and said electron or hole gas layer, said separating layer being in contact with said conducting element on a whole circumference of the latter, said conducting element penetrating into the third semiconducting layer in such a way that the distance between said conducting element and the second conduction electrode is at most equal to 1 µm; and the gate is positioned between said conducting element and the first conduction electrode.

2. The heterojunction field-effect transistor as claimed in claim 1, in which said conducting element and the first conduction electrode include one and the same metal.

3. The heterojunction field-effect transistor as claimed in claim 1, in which said conducting element penetrates into the third semiconducting layer to a depth at least equal to 10 nm.

4. The heterojunction field-effect transistor as claimed in claim 1, in which the third semiconducting layer has the same type of doping as the second semiconducting layer.

5. The heterojunction field-effect transistor as claimed in claim 4, in which the concentration of dopants in the third semiconducting layer is identical to that of the second semiconducting layer.

6. The heterojunction field-effect transistor as claimed in claim 4, in which the separating layer includes a semiconductor material having a type of doping opposite to that of the second and third layers.

7. The heterojunction field-effect transistor as claimed in claim 6, in which the semiconductor material of the separating layer is GaN having a concentration of dopant between $1 \times 10^{17}$ cm$^{-3}$ and $3 \times 10^{17}$ cm$^{-3}$.

8. The heterojunction field-effect transistor as claimed in claim 6, in which the second semiconducting layer separates the first semiconducting layer from the separating layer.

9. The heterojunction field-effect transistor as claimed in claim 8, in which said conducting element is in direct contact with said second conduction electrode.

10. The heterojunction field-effect transistor as claimed in claim 6, comprising an element made of semiconductor material having the same type of doping as the semiconductor material of the separating layer, the element made of semiconductor material connecting the first layer to the separating layer.

11. The heterojunction field-effect transistor as claimed in claim 10, in which the distance between said conducting element and said second conduction electrode is at least equal to 100 nm.

12. The heterojunction field-effect transistor as claimed in claim 1, in which the separating layer is formed of a dielectric material.

13. The heterojunction field-effect transistor as claimed in claim 1, in which the second conduction electrode is positioned at least partially directly below the conducting element.

14. The heterojunction field-effect transistor as claimed in claim 1, comprising a silicon substrate arranged beneath the third semiconducting layer, and a recess being made in the silicon substrate, the second electrode being housed in the recess.

15. The heterojunction field-effect transistor as claimed in claim 1, wherein the first semiconducting layer is of GaN ternary alloy, the second semiconducting layer is of GaN alloy, and said gas layer is an electron gas layer.

16. The heterojunction field-effect transistor as claimed in claim 1, wherein said gate surrounds said first conduction electrode, and said conducting element surrounds said gate.

17. A process for fabricating a heterojunction field-effect transistor, comprising the steps of:

supplying a stack of first and second semiconductor layers of type III-N forming a heterojunction at the level of their interface so as to form an electron or hole gas layer, with a separating layer positioned directly underneath the second semiconducting layer, with a third semiconducting layer arranged beneath the separating layer;

forming a groove through said first and second semiconductor layers and through said separating layer;

forming a conducting element in electrical contact with said electron or hole gas layer and passing through the separating layer for connecting electrically the third semiconducting layer and said electron or hole gas layer, said separating layer being in contact with said conducting element on the whole circumference of the latter, said conducting element penetrating into the third semiconducting layer; and forming a first conduction electrode in electrical contact with said electron or hole gas layer and above the separating layer, forming a second conduction electrode in electrical contact with the third semiconducting layer, the distance between said conducting element and the second conduction electrode formed being at most equal to 1 and forming a gate configured for selectively insulating and connecting electrically two parts of said electron or hole gas layer, so that the gate is positioned between said conducting element and the first conduction electrode at an end of the process for fabricating the heterojunction field-effect transistor.

18. The heterojunction field-effect transistor as claimed in claim 16, wherein said second conduction electrode surrounds said first conduction electrode in a plan view in a direction from a top to a bottom of the heterojunction field-effect transistor.

* * * * *